United States Patent [19]

Aitken et al.

[11] Patent Number: 5,444,015

[45] Date of Patent: Aug. 22, 1995

[54] LARGE SCALE IC PERSONALIZATION METHOD EMPLOYING AIR DIELECTRIC STRUCTURE FOR EXTENDED CONDUCTORS

[75] Inventors: John M. Aitken, Mahopac; Klaus D. Beyer, Poughkeepsie; Billy L. Crowder, Putnam Valley; Stephen E. Greco, Lagrangeville, all of N.Y.

[73] Assignee: International Business Machines Corporation, Armonk, N.Y.

[21] Appl. No.: 225,685

[22] Filed: Apr. 11, 1994

Related U.S. Application Data

[62] Division of Ser. No. 990,678, Dec. 15, 1992, abandoned.

[51] Int. Cl.$^6$ .................................. H01L 21/28
[52] U.S. Cl. .................................. 437/182; 437/195; 437/927
[58] Field of Search .................. 437/182, 195, 927; 257/503, 508, 522, 735

[56] References Cited

U.S. PATENT DOCUMENTS

| | | |
|---|---|---|
| 3,890,636 | 6/1975 | Harada et al. . |
| 3,925,880 | 12/1975 | Rosvold . |
| 4,924,289 | 5/1990 | Matsuoka . |
| 4,933,743 | 6/1990 | Thomas et al. . |
| 5,034,799 | 7/1991 | Tomita et al. . |
| 5,095,352 | 3/1992 | Noda et al. . |

FOREIGN PATENT DOCUMENTS

| | | |
|---|---|---|
| 0476625A2 | 3/1992 | European Pat. Off. . |
| 0550910A1 | 7/1993 | European Pat. Off. . |
| 1189939 | 7/1989 | Japan . |
| 1318248 | 12/1989 | Japan . |
| 63-179548 | 8/1993 | Japan . |

OTHER PUBLICATIONS

IBM Technical Disclosure Bulletin; vol. 32, No. 8A, Jan. 1990; "Structure and Method For Making Multilevel Air Bridge Wiring"; p. 88. (P. 1 only).

IBM Technical Disclosure Bulletin; vol. 32, No. 5B, Oct. 1989; "Method To improve Dielectric Properties of Insulators"; p. 418 (P. 1 only).

*Primary Examiner*—George Fourson
*Attorney, Agent, or Firm*—Whitham, Curtis, Whitham & McGinn; Alison D. Mortinger

[57] ABSTRACT

Fabrication methods for forming a network of walls concurrently with the formation of studs for interconnecting plural device layers of a large scale integrated circuit device permits aggressive reduction of the average dielectric constant of air dielectric structures. Wall sections may be positioned to laterally support high aspect ratio connecting studs with a network of open or closed polygons. Wall patterns may also be open from layer to layer to allow formation of large scale air dielectric structures over a plurality of layers in a single material removal step. A wide range of shear strengths and reductions of average dielectric constant can be achieved even within a single device layer of a large scale integrated circuit and exploited to meet circuit design and device fabrication process requirements.

5 Claims, 7 Drawing Sheets

LARGE SCALE IC PERSONALIZATION METHOD EMPLOYING AIR DIELECTRIC STRUCTURE FOR EXTENDED CONDUCTORS

This application is a divisional of application Ser. No. 07/990,678, filed on Dec. 15, 1992, now abandoned.

BACKGROUND OF THE INVENTION

1. Field of the Invention

The present invention generally relates to the formation of integrated circuits having air dielectrics and, more particularly, to the formation of air dielectric structures having reduced capacitance and of improved structural stability or ease and economy of manufacture.

2. Description of the Prior Art

The manufacture of integrated circuits in recent years has exhibited a trend toward larger scales of integration, that is, the placing of larger numbers of electronic devices on a single chip, and reduction of feature size in design rules for the formation of structures therein. The reduction in feature size basically has reduced the spacing between conductive structures within the integrated circuit device. Increases in scale of integration have resulted in not only more devices on a single chip but increases in length of conductors between functional blocks of the integrated circuit device such as a microprocessor.

It has long been recognized that parasitic capacitances impose a limitation on response speed of any electronic device. Further, capacitive coupling between conductive structures is a substantial and significant source of noise and signal distortion. As is well understood in the art, the capacitance developed between any two conductors is a function of the proximity of the conductors, the areas of the conductors and the dielectric constant of the material between the conductors. Therefore, in large scale integrated circuits, the connections between functional blocks of the integrated circuit can present very substantial capacitances due to the length of conductors involved. Increases in the scale of integration and reduction of design rule feature sizes in the integrated circuits also increases the proximity of conductors and increases capacitive coupling. Further, the number of devices and conductors formed on a single chip increases the number of potential sources of noise in the large scale integrated circuit device. Therefore, in critical locations in an integrated circuit device capacitive coupling is commonly reduced by increasing the spacing between conductors and minimizing the length of the portions of conductors which are run in parallel.

These effects of capacitive coupling have become significant even for relatively short conductors (e.g. under 30 microns) under currently feasible design rules. In such a case, where the conductor spacing cannot be increased, the only viable alternative for reduction of capacitance is by reduction of the dielectric constant of the insulating material between the conductors. The dielectric constant of silicon dioxide, the commonly provided insulating material in silicon-based semiconductor devices, is approximately 3.9. Polyimide materials, having a dielectric constant of about 3.1 to 3.5, can thus reduce the capacitive coupling by 10% to 20%. Also, other polymeric compounds are known which have dielectric constants in the ranges of 2.0–2.2 but which exhibit insufficient thermal stability for integrated circuit applications. Therefore, to reduce the dielectric constant below 3.0, it is necessary to provide a So-called air dielectric structure. Since the dielectric constant of air is, by definition, 1.0, the replacement of high dielectric constant material with air can reduce the average dielectric constant of the volume, consisting partially of dielectric material and partially of air, within the electric field between the conductors.

Air dielectric structures are basically formed by the deposition of a removable material as a temporary support for the formation of a conductor. After the conductor is formed, the removable material is etched away or dissolved leaving the conductor suspended above other structures or conductors. Examples of such structures are disclosed in U.S. Pat. Nos. 3,890,636 to Harada et al., 5,034,799 to Tomita et al., 3,925,880 to Rosvold, and 4,933,743 to Thomas et al. However, as can be readily understood, such suspended conductors are not structurally robust and may sag into contact with other conductive areas or be damaged by shock or vibration if not limited in length. Therefore, known air dielectric structures have been limited to very short lengths and have not been applied to reduction of capacitive coupling between longer conductors used to connect functional blocks in large scale integrated circuits.

Air dielectric structures can also be easily damaged during further processing steps such as in the production of additional circuit layers, often encountered in large scale integrated circuits. Since air dielectric structures are essentially voids in the device structure, a degree of structural weakness is unavoidable. Production of multiple layers of conductive patterns in combination with air dielectric structures is particularly difficult since conductors must be formed on highly planar surfaces in order to achieve conductor lines of consistently regular cross-sectional area. Planarization of surfaces for conductor formation requires some degree of mechanical polishing with unavoidable application of shear and compressional forces to the structure. Underlying air dielectric structures are inherently weak in compression perpendicular to the substrate. More importantly, however, air dielectric structures necessarily involve conductors extending in a direction generally perpendicular to the substrate, referred to as studs which define the spacing of the conductors of the air dielectric structures in that direction. For structures involving only short conductors, as in the above-cited Patents, the height of these studs need not be large for reduction of capacitance and the height to transverse dimension aspect ratio is low. Such a low aspect ratio results in generally adequate strength in shear to avoid damage during planarization. However, for longer conductor runs encountered in large scale integrated circuits, it is desirable to increase the spacing between conductive layers to a point where it is not practical to maintain a low aspect ratio of the conductive studs. This limitation derives from the fact that for a given degree of integration density in a layer, increase in size of a feature will reduce the separation between features. Therefore, in large scale integrated circuits, studs are inherently weak in shear. This weakness, when multiple layers containing extended conductor runs must be formed, has limited the incorporation of air dielectric structures and exploitation of the reduction of capacitive coupling potentially available.

SUMMARY OF THE INVENTION

It is therefore an object of the present invention to provide an air dielectric structure capable of being formed in multiple layers.

It is another object of the invention to provide an air dielectric structure which is applicable to conductors having a run length of greater than 100 microns.

It is a further object of the invention to provide a support structure for conductors which provides an air dielectric and is sufficiently structurally robust to withstand planarization by polishing.

In order to accomplish these and other objects of the invention, an air dielectric structure including a conductor in a first conductor layer which is spaced from a second conductor layer, at predetermined intervals, by at least a conductive stud and at least one wall segment, the wall segment and the stud being separated by the predetermined interval.

In accordance with another aspect of the invention, a method of forming an air dielectric structure including the steps of forming a layer of removable material on a surface, patterning the removable material to form relatively narrow wall openings and relatively wide stud openings, conformally depositing an insulating material on the removable material to cover the interior of the relatively wide stud openings and to fill the relatively narrow wall openings, directionally etching the insulating material deposited by the conformally depositing step, filling remaining volume in the relatively wide stud openings with conductive material, forming a patterned layer over the layer of removable material including the wall openings which have been filled by the conformally depositing step and said filling step, and removing said removable material.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
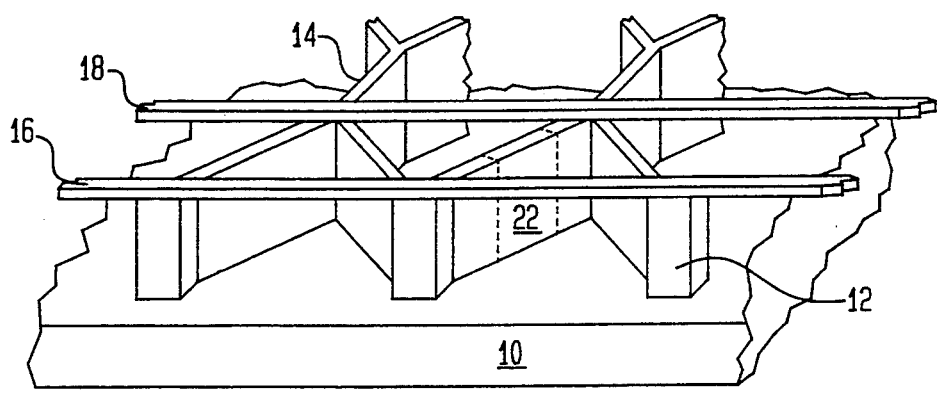
FIGS. 1A are 1B are isometric views of two structures in accordance with the invention.

Referring now to the drawings, and more particularly to FIG. 1A, an isometric view of one preferred form of the invention is shown. The structure shown is formed on substrate 10 which could also comprise an upper layer of an integrated circuit device at an intermediate stage of formation. Contact studs 12 are shown for making contact with other conductors on or in substrate or layer 10. Extending between these contact studs 12 is a network of walls 14 formed of an insulating material which may form cells having an open or closed geometry in the plane of substrate or layer 10. The cell structure of FIG. 1a includes a pattern of closed polygons extending in a direction parallel to the substrate surface. These cells may be open in a direction perpendicular to the substrate surface. A fully closed cell structure is shown in the embodiment shown in FIG. 1B. Conductor 16 is shown in FIG. 1A as extending across the tops of the contact studs and supported at intervals thereby, preferably on the order of 50 microns or less. Conductor 18 is shown as extending across the upper edges of insulating walls 14 and also supported thereby at intervals on the order of 50 microns or less. Clearly, a combination of such supporting structures would normally be used in a particular device since a particular conductor would connect only a selected plurality of contact studs 12 while being supported at other locations by the upper edges of walls 14. The locations of conductors is relatively arbitrary as long as desired connections are made in accordance with the electrical design of the device. Thus, the formation of these conductors is referred to as "personalization" and the structure of a "device layer" (which could include a number of physical layers) for providing an interconnection pattern is often referred to as a "personalization layer".

As is evident from the structure shown in FIG. 1A, the spacing of supports for a conductor, in order to avoid conductor sagging which would cause shorting to another conductor in the same or an adjacent layer or sufficient elongation of a portion of the conductor to cause breakage or significant reduction in cross-sectional area of a conductor, is affected by both the layer thickness (e.g. the wall height) and the minimum feature size permitted under the design rules for a layer and neighboring layers. Increases in wall height tends to reduce capacitance between conductors but, for a given wall thickness, tends to reduce strength of the wall in regard to tolerance of shear forces. Increases in wall thickness tends to increase capacitance between conductors by increasing the average dielectric constant of the material interposed between the conductors. These design trade-offs will be readily understood by those skilled in the art in view of this disclosure. As a practical matter, wall height is generally a small multiple (e.g. 2 to 5) of the wall width which cannot be less than the minimum feature size specified by the design rules.

Since the number of walls supporting a conductor should also be minimized to avoid raising the average dielectric constant between conductors, it is desirable to maximize spacing between conductor supports. Also, since conductors are supported by both walls and selected studs, spacing between studs and walls must be accurately regulated. If studs and walls are formed in different processes, as would be implied by the different materials of which they are formed, such regulation of position is extremely difficult. Errors in positional registration between the processes could therefore cause increases in the distances between conductor supports on the order of the minimum feature size. While this error is small, it is a substantial percentage of the maximum allowable distance between supports and maximizing wall separation to minimize the number of walls and average dielectric constant could not be done aggressively. Therefore, an important feature of the present invention is the concurrent formation of walls and studs using the same mask art work which eliminates spacing errors within any given layer.

Walls 14 are preferably integrated with studs 12 in order to reinforce the latter. During fabrication of an air dielectric structure, connections such as 16 and 18 must be formed on a planarized surface such as 20 of FIG. 1B. However, the air dielectric cavity or a precursor structure must often be formed prior to the surface or at least the planarization thereof. Planarization of the surface requires some degree of mechanical polishing which, in turn, requires application of shear forces to the structure. Contact studs 12, alone are not capable of supporting such a surface during polishing and also will not generally be available to support conductors at the necessary intervals for all desired conductor locations. Walls 14 are therefore preferably located so that wall segments intersect at stud locations, as shown. Such location is not critical to the practice of the invention but results in maximum strength for withstanding polishing and other processing steps which can cause stress on the studs.

It should be noted that cells formed by the pattern of wall segments 14 in accordance with the invention can be either closed polygons or open patterns which omit some wall segments or portions thereof. The cells of air dielectric structures in accordance with the invention can also be either open or closed from layer to layer depending on the presence or absence of layer 20 or openings therein. Even a relatively open pattern of wall segments 14 can form a closed polygon of relatively large size covering one or more regions of the wall pattern. When such a closed region is formed in a layer and the region is also to be closed by a surface 20, removal of removable material to form the air dielectric structure must be done before proceeding with the formation of subsequent device layers. On the other hand, the invention also provides for the formation of structures which may be open in directions either parallel or perpendicular to the plane of the substrate, or a combination of both.

More specifically, in different preferred embodiments of the invention, either open or closed cell structures may be employed which allow differing manufacturing sequences that may each be advantageous in particular manufacturing processes. Closed cell structures provide maximum lateral reinforcement of the studs 12 but require additional processing steps to remove material from the air dielectric cavities as each layer is formed. Open cell wall patterns, such as that of FIG. 15, have the advantage of allowing material removal from air dielectric volumes of a plurality of layers at the same time if openings are provided in layer 20. Further, since less material is provided in the walls 14 and layers 20 of open cell structures, a lower dielectric constant per unit length of conductor can be achieved. However, it is to be understood that the practice of the invention is not limited to only one of open and closed cell structures in any device or even in any single layer within a device. Rather the designations of "open cell" and "closed cell" are used for associating the structures with potential differences in the processes by which they are most effectively and advantageously formed. The range of wall formations which may be created in accordance with the invention should be viewed as structures which allow reduction of average dielectric constant per unit length for long conductors beyond that which is otherwise available in the art by the provision of insulating walls for the periodic support of conductors as well as for the lateral support of conducting studs as may be desirable or necessary in any particular large scale integrated circuit design. For example, the structure of FIG. 1A could readily be formed as an open cell structure by formation of the walls without wall region 22 with only moderate reduction in strength.

Figure 2:
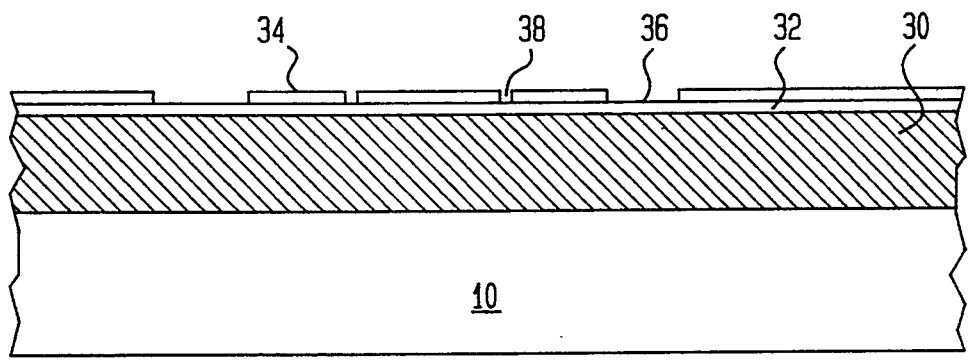
FIGS. 2, 3, 5, 6, 7, 8, 9, 10 and 11 are cross-sectional views illustrating the fabrication of an embodiment of the invention corresponding to FIGS. 1A and 1B.

Referring now to FIGS. 2-11, the fabrication of a basic form of the invention will now be described. As shown in FIG. 2, a relatively thick layer (to define wall height) of removable material 30 has been deposited on a substrate 10 (which is assumed to include a conductive pattern (not shown)), which is, in turn, capped by a passivation layer 32 such as silicon dioxide deposited by a low temperature chemical vapor deposition (CVD) process or a composite passivation layer structure consisting of a layer of silicon dioxide, a reactive ion etch (RIE) stop layer of a material such as aluminum oxide, and a further top layer of silicon dioxide. The removable material 30 is preferably a water soluble glass or an organic polymer such as polyimide.

The passivation layer is then masked for patterning with mask 34 which can be formed by any of many known processes such as photolithography or electron beam or x-ray lithography. It should be noted that mask 34 provides for the wall locations, depicted as narrow mask openings 38, and also for the desired pattern of conductive studs, depicted by wide mask openings 36. The passivation layer is then patterned using one or more etching steps appropriate to the composition thereof and the mask 34 removed, leaving the patterned passivation layer as a mask for removal of portions of the removable material layer 30. The removable material is then removed by dry etching, leaving the structure shown in FIG. 3. As is evident therefrom, removal of the portions of removable material 30 in registration with openings 36, 38 in the passivation layer 32 forms corresponding wide and narrow openings 36', 38' in the removable material layer. It should be noted that the pattern of openings depicted in FIGS. 2 and 3 corresponds to section III—III shown in the top view of the wall and stud pattern of FIG. 4.

Figure 4:
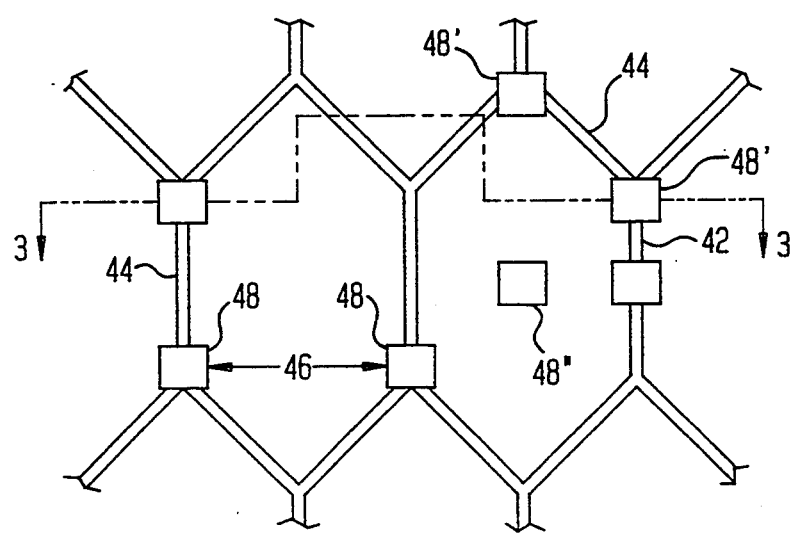
FIG. 4 is a top plan view of a wall and stud pattern at the state of fabrication of FIGS. 3, 6 or 7, FIGS. 12, 13 and 14 are cross-sectional views illustrating fabrication of a variation of the invention.

From FIG. 4, it should also be noted that it is preferred that the wall segments form a two-dimensional network or pattern and that the intersection of walls occur at stud locations at as many locations as possible for structural robustness. The network of walls can be in any pattern such as triangles, squares, hexagons, etc. or portions thereof or serpentine patterns or portions thereof or combinations of any or all of these geometries.

As a matter of design, serpentine or hexagonal "honeycomb" patterns are preferred since they provide high strength with small wall thickness and also will usually provide a pattern which does not regularly extend directly between adjacent stud locations (e.g. from stud to stud). The rationale for this choice is that walls extending directly between stud locations, such as is shown at 42 and 44, increase the average dielectric constant and capacitive coupling between the studs. In contrast, only the air dielectric is present at 46 and the capacitive coupling between studs 48 will be far less than between studs 48' even though the respective separations are similar and the studs connected structurally by two wall segments. Accordingly, it would be desirable to omit all or a portion of wall segments or sections 42 and 44, which can be easily done without significantly reducing the structural robustness provided by the remainder of the wall network or pattern. It should also be noted in this regard that the wall network need not support all studs such as 48″, since the structural robustness of the remainder of the wall network or pattern will effectively protect such areas from damage by shear forces during planarization polishing.

Figure 5:
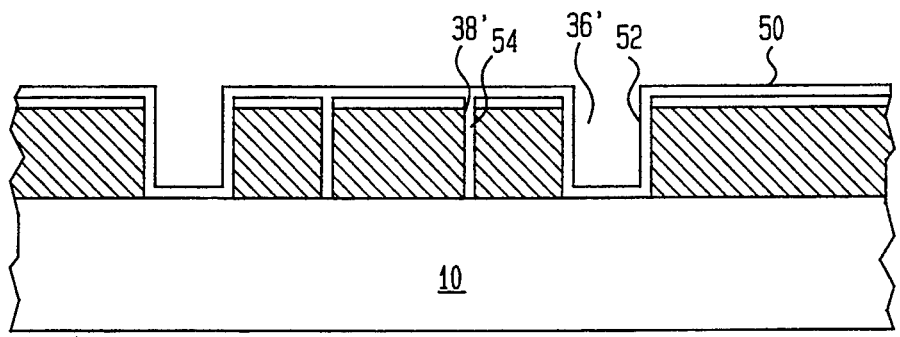
Figure 6:
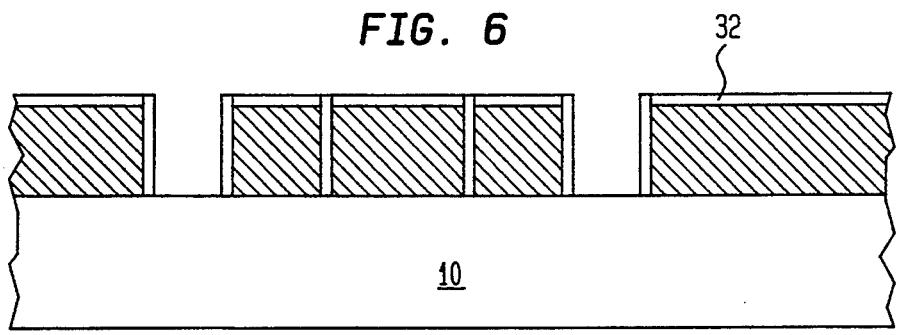

Next, as illustrated in FIG. 5, a conformal layer of insulating material such as silicon dioxide is deposited, preferably by chemical vapor deposition. This conformal deposition does not have a preferred direction and forms sidewalls 52 in the stud openings 36′ and fills wall openings 38′ to form wall segments 54. Then, as shown in FIG. 6, etching in a preferentially vertical direction is done, preferably as a directional timed RIE etch back with a fluorinated hydrocarbon such as tetrafluoromethane, to remove the deposited insulator material from the upper surface of layer 32 and from the bottoms of the stud trenches 36′. This process can be allowed to continue slightly longer than is required to remove the deposited material since it will have the effect of cleaning the bottoms of the stud trenches for good electrical contact with metal to be deposited therein. Passivation layer 32 is of the same material (e.g. silicon dioxide) as the deposited material being etched and removal of some of the passivation layer 32 is largely irrelevant to the resulting structure if the passivation layer is initially formed with sufficient thickness.

Figure 7:
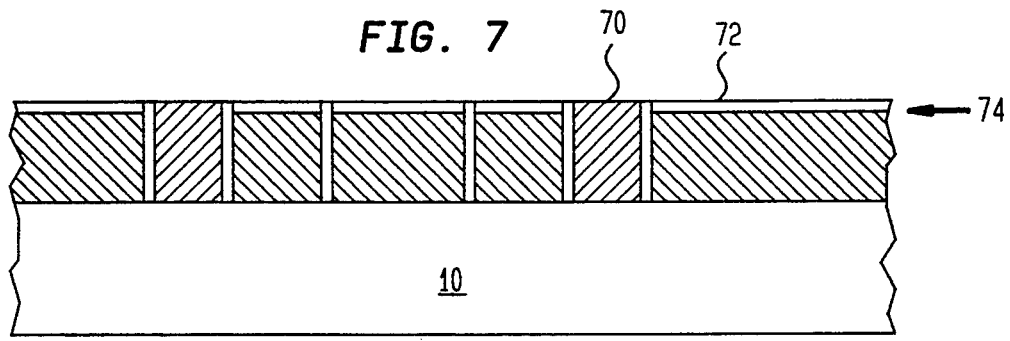
Figure 8:
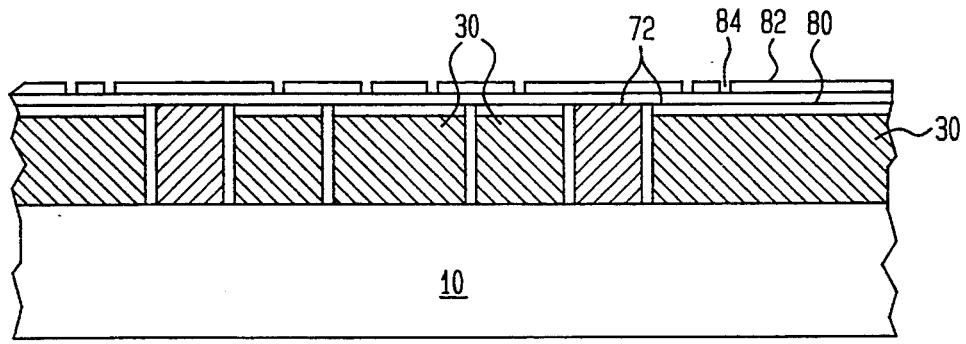

As shown in FIG. 7, the stud trenches 36′ are then filled, as shown at 70, with metal or other conductive material by any desired method and the surface is planarized, removing deposited material from the surface by mechanical or chemical/mechanical polishing. As is known in the art, the chemical composition of a polishing slurry can be adjusted to provide preferential material removal. Toward the completion of the process, it is desirable to provide for less removal of the deposited stud material so that the conductive material (e.g. metal) of studs 70 will slightly protrude from the surface or at least not be recessed below the surface of the layer. Since the removable material remains in place, the studs are not mechanically damaged by shear forces during planarization polishing. Also, during the planarization process, additional deposition of insulator may be done to assure suitable remaining thickness 80, as shown in FIG. 8, of passivation layer 32 to form a surface 20 of FIG. 1B, if desired. Such an insulating and support layer would provide additional support for the conductors 16 since the residual passivation layer 32 may vary in thickness due to prior planarization processing such as chemical-mechanical polishing.

Figure 9:
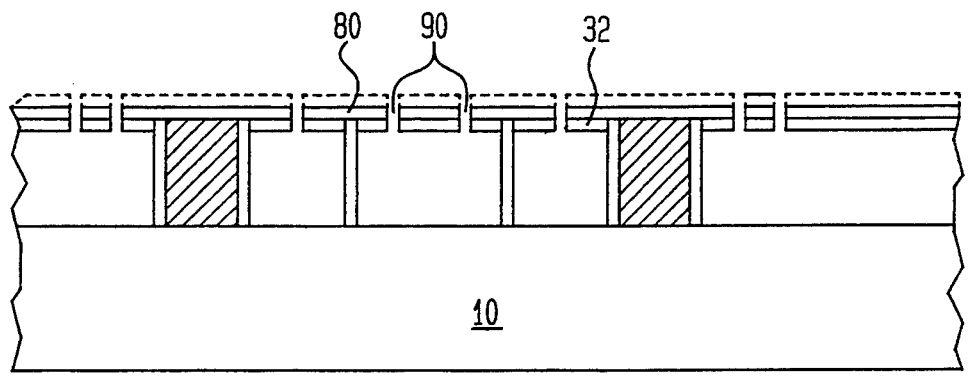
Figure 10:
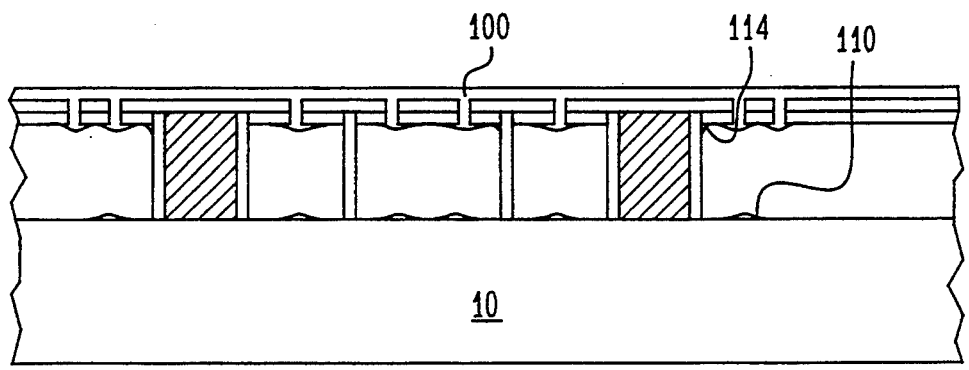

As shown in FIG. 8, one or more layers 80 are then deposited on planarized surface 72 of FIG. 7. These layers may include further insulating material similar to the deposition during the planarization process described above and/or metal or other conductive material to form the next conductive pattern. This deposited material is then covered with mask layer 82 including apertures 84, preferably in the form of long, narrow slits in order to promote the rapid progress of removal of the removable material 30. Then, by RIE etching of the dielectric layers 80, 32, preferably in tetrafluoromethane, the slits 100 are formed through layers 80 and 32 to reach the removable material 30 which is then removed to form the air dielectric cavities, as shown in FIG. 9. The slits are then closed by applying an insulative material such as silicon dioxide, preferably by a non-conformal CVD process. Some deposition of material within the cavities is unavoidable as is shown at 110 and 114. However, this material does not significantly increase the average dielectric constant between conductors as long as the process is conducted in a manner to substantially maximize the directionality of the deposition. It should be noted that this closure of the slits may be omitted if planarization has been continued to level 74 (FIG. 6) and layer 80 is comprised only of conductor material. If this is the case, slits 84 can be wider and form the separation between conductors 16 and 18 of FIG. 1A. However, no further layers could be applied above this layer.

On the other hand, even if layer 80 contains conductors, filling of the slits with insulator provide for the formation of two or more series capacitances between conductors in the same layer and thus may increase capacitive coupling therebetween. At the same time, a continuous surface is formed on which the entire process depicted in FIGS. 2–10 may be repeated, at will, to form a device of any desired degree of complexity.

Figure 1B:
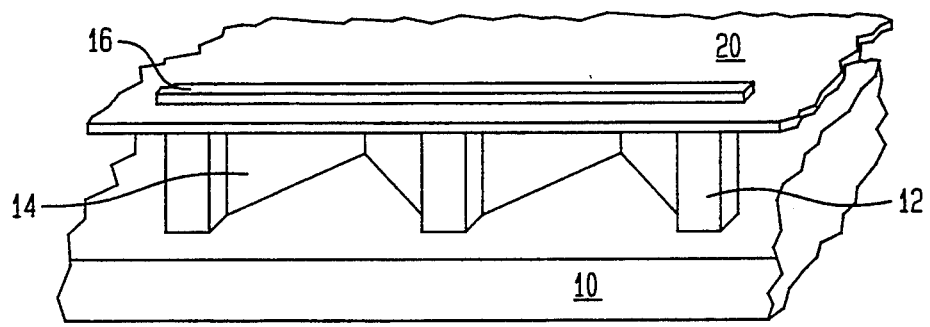
Figure 11:
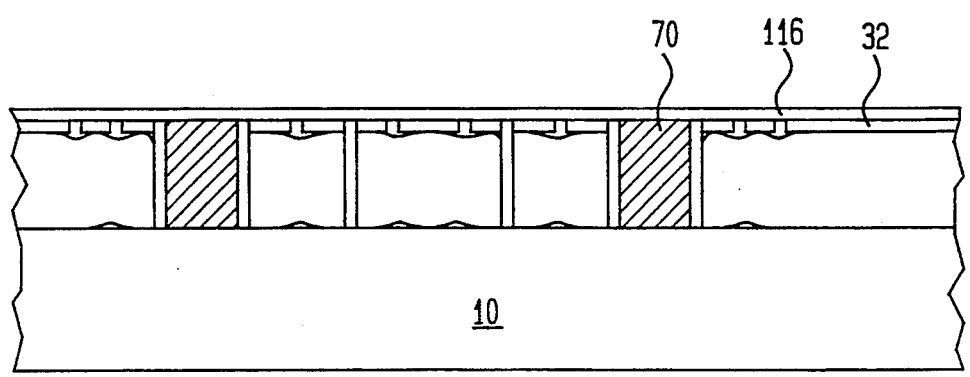

If layer 80 does not contain conductors, it is necessary to again planarize the surface to expose studs 40 and deposit a conductive patternable layer 116 to complete the structure as shown in FIG. 1B and 11. Filled layer 32 thus forms surface layer 20 of FIG. 1B and conductor 16 of FIG. 1B is formed by the patterning of layer 116.

It should be noted that the structure of FIG. 1B and 11 includes air dielectric cells which are potentially closed both by the closed polygons of the wall pattern and at the top and bottom by layers 20 or the substrate. Therefore it is necessary to remove the removable material 30 from closed cells as each layer is formed. However, it should also be recognized that only some portions of the wall pattern may include such closed cells and removal of the removable material from areas which contain only open wall patterns may be deferred for a plurality of layers. Since the removable material is preferably removable by plasma etching rather than wet etching, the material removal process can take place over a considerable thickness (e.g. number of layers) and tortuous paths without damage to the remainder of the structure. Nevertheless, the topology of the entire device design should be considered in the fabrication process to ensure that access to volumes of removable material will always be available in those areas where long conductor lines are present for connecting different functional blocks within the same chip.

In this regard, it should be noted that the incorporation of air dielectric structures can be limited to those areas which would benefit most from the electronic performance gain of an air dielectric scheme, such as long wiring lines between functional blocks on the same chip. Also, in metal stud and wiring areas of high density, the formation of an air dielectric by the removal of a temporary dielectric can be difficult because of tight lithographic design rules. In addition, chip areas with a dielectric material are mechanically more stable than areas with an air dielectric. Therefore, it is desirable for the enhancement of structural reliability to limit the areas with an air dielectric. Thus, as will be understood by those skilled in the art, a compromise must be reached between areas with an air dielectric and areas with remaining removable dielectric material, as is preferred for ease of manufacturing. The choice of the removable dielectric material for a confined air dielectric concept should be a material with a low dielectric constant and with thermal stability in the temperature range commonly applied for wire interconnection schemes. Glasses like borosilicates of polymeric compounds such as polyimide are suitable for this purpose.

Figure 15:
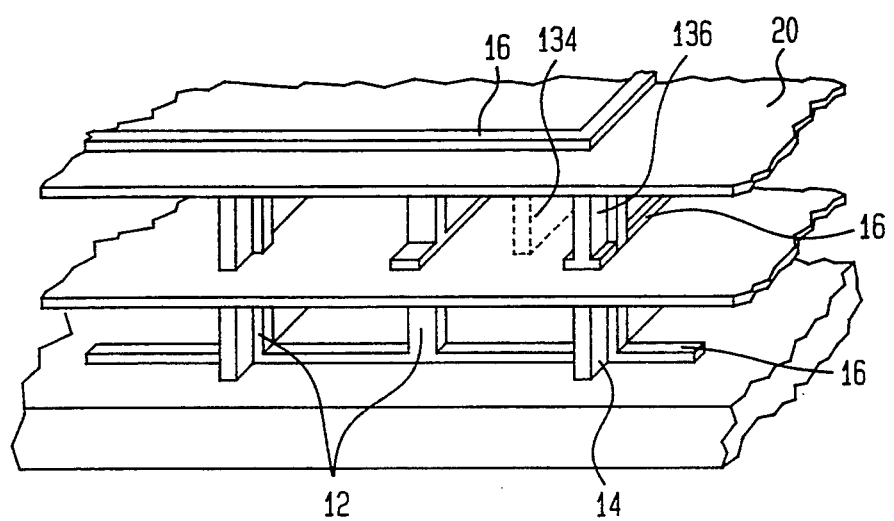
FIG. 15 is an isometric view of one type of open cell embodiment of the invention.

It should also be noted that since the dielectric constant of air is, by definition, 1.0 and the dielectric constant of any applicable insulator is several times larger, the presence of insulator material in any location tends to increase capacitive coupling between conductors. Accordingly, the invention is intended to provide for a minimum of wall material to remain, consonant with maintaining sufficient structural robustness of the wall network or pattern. It should also be understood that the reduction of capacitive coupling between conductors addressed by this invention is a three-dimensional problem. All conductive structures, including studs 12, 70, which run in the same direction over any significant distance should be considered and the wall pattern adjusted to reduce capacitive coupling therebetween. Therefore, the conductors associated with the substrate 10, assumed above, should be formed on the surface of the substrate rather than embedded in it, as shown in FIG. 15. Likewise, conductors formed on subsequent layers 20 should not be embedded in the surface since the dielectric of the layer will serve to increase the capacitive coupling between conductors.

For this reason, the wall pattern or network should generally run at a large angle to the conductors either above or below. This is usually inherent in designs of multi-layer devices since conductors in alternate layers will generally run perpendicular to each other to maximize possibilities for interconnection by studs. However, this implies that conductors in a single layer will be run predominantly in parallel. In such a case, capacitive coupling can be minimized by placing walls on the conductors rather than between them whenever possible. In determining the possibility of so doing, walls should clearly not be positioned on conductors where conductors run in parallel in adjacent layers for the same reason that walls should not be run between adjacent studs as discussed above in connection with FIG. 4. However, significant structural as well as electrical advantages accrue in accordance with the invention by forming walls on conductors where possible by the methodology which will now be discussed in connection with FIGS. 12-14. Of course, walls could be positioned to coincide with overlying conductors but the reduced height of the wall segment would not be achieved over the full length of the wall segment.

Figure 3:
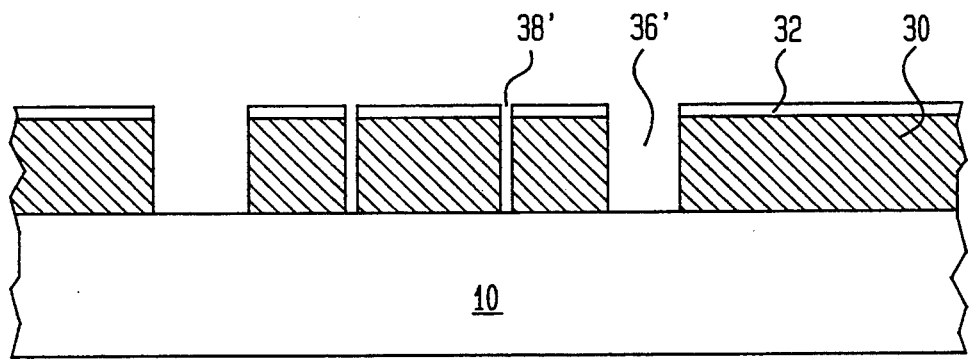
Figure 12:
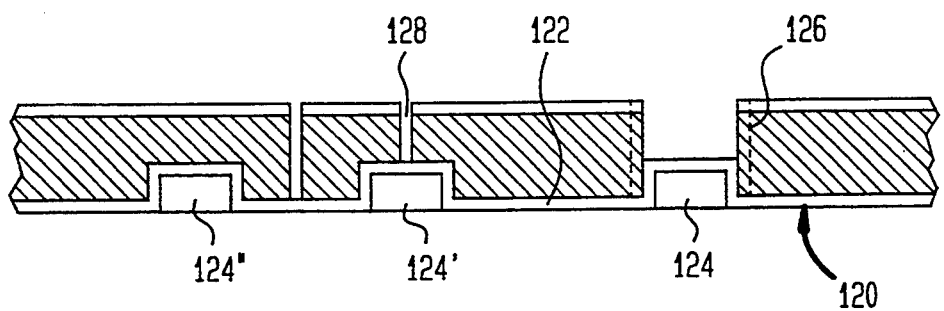

FIG. 12 basically corresponds to the point of the above-described process illustrated in FIG. 3. The illustrated structure is the same except that the thickness of substrate 10 is not depicted and surface 120 is intended to be generic to the surface of substrate 10 and the surface of any layer 20, as shown in FIG. 1B. Further, the conductors 124, assumed and not illustrated in the foregoing discussion are now illustrated and covered by a further passivation layer 122. Trenches for walls and studs have been formed in the manner described above. It should also be noted that, if desired for larger stud cross-section, the stud trenches may be made significantly larger than the transverse dimension of the conductors 124, as shown by dashed lines 126. The sidewalls 132, which also serve to reinforce the studs against damage from shear forces can then reach to surface 120 and the stud, itself, can thus be formed with the same or larger transverse dimension than the conductor 124, as shown in FIG. 13.

Figure 13:
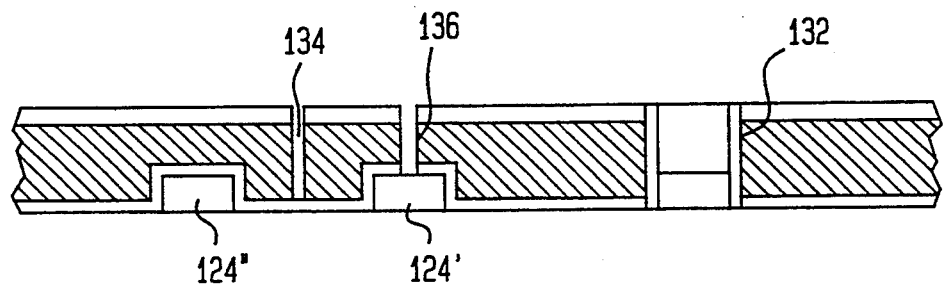

Also shown in FIG. 13, which corresponds to the state of the above-described process depicted at FIG. 6, the wall trenches have been filled and the stud sidewalls formed by conformal CVD. The etching to remove the passivation layer 122 over conductor 124 also opens layer 122 over conductor 124' in the wall trench 128. However, this latter opening is unimportant since the opening is then filled with insulating material which is unaffected, as before, by a subsequent etch back process to open the bottom of the stud trench to the conductor 124.

Figure 14:
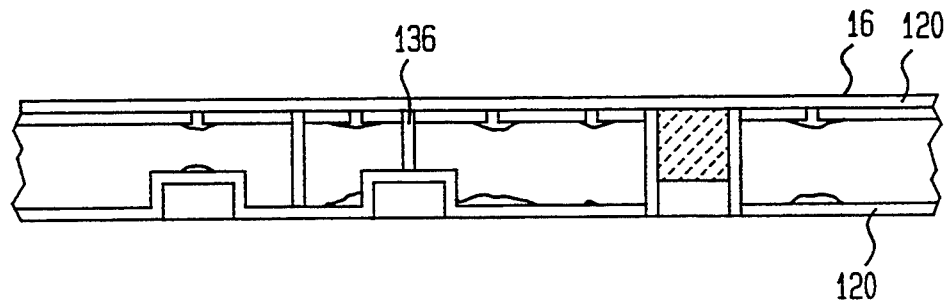

It should also be noted that the wall segment formed on conductor 124' is of a height which is reduced by the height of the conductor. A wall of such reduced height will be inherently more stable against shear forces than a full height wall. This stability may be enhanced greatly with little additional wall material by slightly increasing the thickness of such wall portions. This increase in stability can be exploited by reducing the wall thicknesses at other locations such as at 134 where, presumably, a wall was required at a position which was not matched by a conductor. Thus, the average dielectric constant between conductors 124' and 124" can be held to a minimum even when the provision of a wall at such a location cannot be otherwise avoided in the wall network or pattern design. The device is completed by cell closure after removal of removable material as shown in FIG. 14, which correspond to FIG. 10 or 11 in the above described process.

The embodiment of the invention depicted in FIG. 15, in addition to forming walls on conductors, also differs from the embodiments of FIGS. 1A and 1B since the wall pattern is an open configuration rather than being predominantly of closed polygons. Nevertheless, the embodiment of FIG. 15 is potentially closed from layer to layer by layers 20. Openings could be left, however, to allow removal of removable material over several layers, as desired or dictated by the device design topology. Such a fully open design topology will now be described with reference to FIGS. 16-19.

Figure 16:
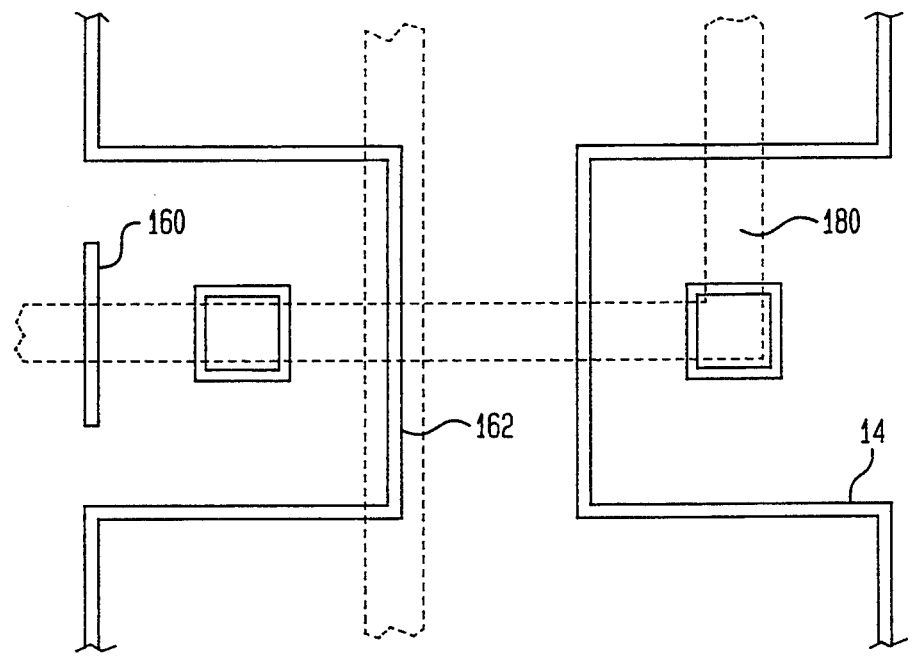
FIGS. 16, 17 and 18 are cross-sectional views illustrating fabrication of an open cell embodiment of the invention.

FIG. 16 is a plan view of an open wall pattern such as might be employed in the embodiment of FIG. 15. The walls 14 are preferably of a serpentine or other two-dimensional pattern to provide strength in shear in any direction. Additional short wall segments 160 can be included where desired or necessary.

Figure 17:
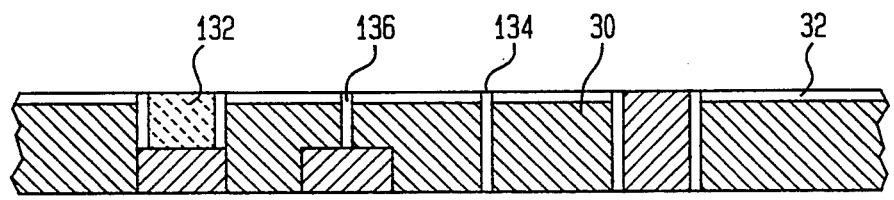
Figure 18:
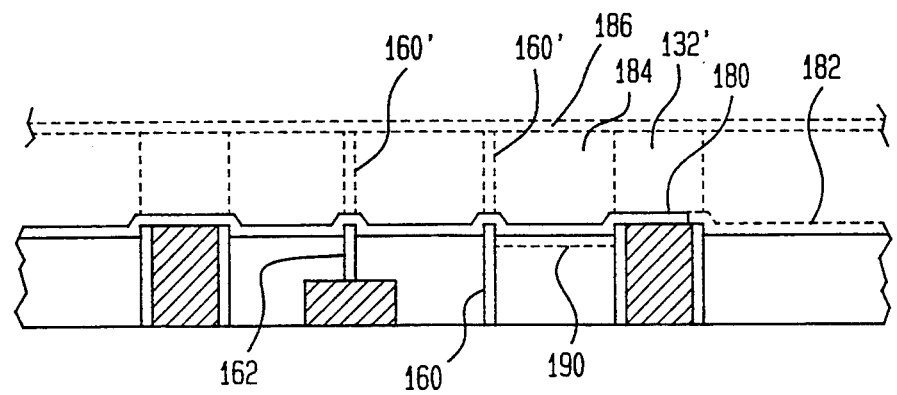

FIG. 17 shows the structure after planarization, corresponding to the fabrication state shown in FIG. 7 or 13 in the above described processes. However, in this case, passivation layer 32 is then removed, preferably by etching, and a conductive layer 180 directly applied to the resulting surface of studs 132, walls 134, 136 and removable material 30. Conductive layer may be a single layer of conductive material or a composite of a plurality of layers of differing materials, such as copper and gold to simultaneously achieve both high conductivity and strength. Conductive layer 180 may be applied in a desired pattern or patterned after application by known techniques as indicated at 182. To form additional layers, a further layer of removable material 184 and passivation layer 186 may then be applied directly over the open conductor pattern and the process repeated as many times as desired, forming walls 160' and studs 132' as desired. It should be noted that any removable material which is attacked (e.g. at 190) during the patterning of conductive layer 180 will be replaced when the next layer of removable material is applied. It should be further noted that this process will allow formation of wall networks of closed polygon design, such as that of FIG. 1A in multiple layers and without intervening insulative layer 20 of FIG. 1B. Further, the number of steps of removing removable material is potentially reduced to one.

Figure 19:
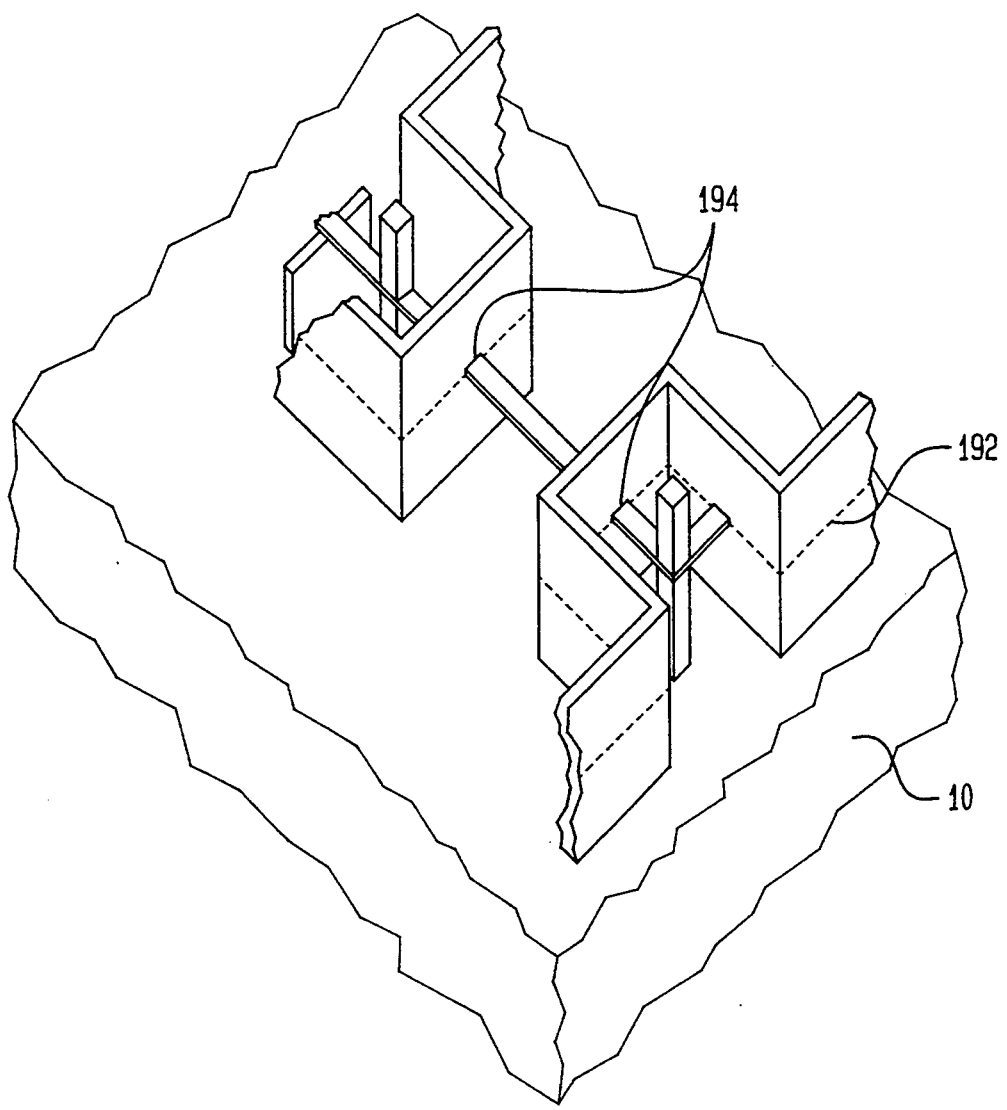
FIG. 19 is an angled isometric view of another form of an open cell embodiment of the invention.

The high degree of openness produced when this technique is applied to an open wall pattern such as that Of FIG. 16 may be appreciated from the isometric view of this embodiment of the invention, shown in FIG. 19, as fabricated through two layers above a substrate 10. The division between the two layers is depicted as a dashed line 192 for clarity. However, a substantially continuous structure will result in which conductors are periodically embedded, such as at 194; providing support in all directions transverse to the length of the conductors. Thus, in summary, this embodiment of the invention especially provides for aggressive minimization of insulative materials used to support conductors within a large-scale air dielectric structure while maintaining a substantial degree of structural robustness in both compression and shear. In a more general concept, walls of different personalization layers do not have to be aligned to each other, if the surface layer 20 acts as a ceiling layer for metal lines or studs as shown in FIG. 15.

In view of the foregoing, it is seen that the invention provides for the formation of a wide variety of air dielectric structures which are able to accommodate a wide variety of device designs as to both structural robustness and reduction of capacitive coupling between extended conductors. Further, it is to be understood that, within limits, structural robustness in one area of a device layer may be exploited in a neighboring area where reduction of capacitive coupling may be more critical. Air dielectric structures in accordance with the invention can be limited to those areas where the impact on electrical performance is most significant. By confining the air dielectric structures, the overall structural robustness of the chip is enhanced while signal coupling between long connection lines is minimized.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming an air dielectric structure including the steps of forming a layer of removable material on a surface, patterning said layer of removable material to form relatively narrow wall openings and relatively wide stud openings, conformally depositing an insulating material on said removable material to cover the interior of said relatively wide stud openings and to fill said relatively narrow wall openings, directionally etching said insulating material deposited by said conformally depositing step, filling resulting remaining volume in said relatively wide stud openings with conductive material, forming a patterned layer over said layer of removable material including said relatively narrow wall openings which have been filled by said conformally depositing step and said filling step, and removing said removable material.

2. A method as recited in claim 1, including the further step of closing open regions in said patterned layer.

3. A method as recited in claim 1, wherein said step of patterning said removable material includes the step of forming at least one said relatively narrow wall opening over a conductor on said surface.

4. A method as recited in claim 1, wherein said step of patterning said removable material includes the step of locating an end of at least one of said relatively narrow wall openings at a boundary of at least one said relatively wide stud opening.

5. A method as recited in claim 1, including the further steps of planarizing a surface of said removable material, and applying a conductor pattern to said surface of said removable material planarized by said planarizing step.

* * * * *